(12) United States Patent
Choi et al.

(10) Patent No.: US 10,008,594 B2
(45) Date of Patent: Jun. 26, 2018

(54) HIGH VOLTAGE SEMICONDUCTOR DEVICE

(71) Applicant: DONGBU HITEK CO., LTD., Seoul (KR)

(72) Inventors: Kee Joon Choi, Gyeonggi-do (KR); Bum Seok Kim, Seoul (KR); Bon Sug Koo, Gyeonggi-do (KR); Mi Hye Jun, Gyeonggi-do (KR); Hae Taek Kim, Gyeonggi-do (KR); Duk Joo Woo, Gyeonggi-do (KR)

(73) Assignee: DB HITEK CO., LTD., Seoul (KR)

( * ) Notice: Subject to any disclaimer, the term of this patent is extended or adjusted under 35 U.S.C. 154(b) by 0 days. days.

(21) Appl. No.: 15/455,798

(22) Filed: Mar. 10, 2017

(65) Prior Publication Data

US 2017/0278922 A1 Sep. 28, 2017

(30) Foreign Application Priority Data

Mar. 25, 2016 (KR) .................. 10-2016-0035911

(51) Int. Cl.
*H01L 29/00* (2006.01)
*H01L 29/78* (2006.01)
*H01L 29/66* (2006.01)
*H01L 29/08* (2006.01)

(52) U.S. Cl.
CPC ...... *H01L 29/7816* (2013.01); *H01L 29/0847* (2013.01); *H01L 29/66659* (2013.01); *H01L 29/7835* (2013.01)

(58) Field of Classification Search
None
See application file for complete search history.

(56) References Cited

U.S. PATENT DOCUMENTS

| 2006/0141714 | A1  | 6/2006  | Lee |
|---|---|---|---|
| 2010/0123195 | A1  | 5/2010  | Lee |
| 2012/0175673 | A1* | 7/2012  | Lee ................ H01L 27/0277 257/140 |
| 2016/0087039 | A1  | 3/2016  | Ko |
| 2016/0351706 | A1  | 12/2016 | Jung et al. |

FOREIGN PATENT DOCUMENTS

| KR | 1020060077006 A | 7/2006 |
|---|---|---|
| KR | 1020100056101 A | 5/2010 |

* cited by examiner

*Primary Examiner* — Reema Patel
(74) *Attorney, Agent, or Firm* — Patterson Thuente Pedersen, P.A.

(57) ABSTRACT

A high voltage semiconductor device includes a gate electrode structure disposed on a substrate, a source region disposed in the substrate to be adjacent to one side of the gate electrode structure, a first drift region disposed in the substrate to be adjacent to another side of the gate electrode structure, a drain region electrically connected with the first drift region, and a device isolation region disposed on one side of the drain region. Particularly, the first drift region is spaced apart from the device isolation region.

19 Claims, 3 Drawing Sheets

HIGH VOLTAGE SEMICONDUCTOR DEVICE

CROSS-REFERENCE TO RELATED APPLICATION

This application claims the priority benefit of Korean Patent Application No. 10-2016-0035911, filed on Mar. 25, 2016, and all the benefits accruing therefrom under 35 U.S.C. § 119, the contents of which are incorporated by reference in their entirety.

BACKGROUND

The present disclosure relates to a high voltage semiconductor device including a drift region.

A Metal Oxide Semiconductor Field Effect Transistor (MOSFET) may have relatively high input impedance compared to a bipolar transistor, providing a relatively large power gain and/or a relatively simple gate driving circuit. Further, the MOSFET may be a unipolar device having substantially no-time delay which may result from minority carrier storage and/or recombination while being turned off. The MOSFET may be applied to switching mode power supply devices, lamp ballasts, motor-driving circuits and the like. For example, a DMOSFET (Double Diffused MOSFET) manufactured by using a planar diffusion technology is generally used.

A lateral double diffused metal oxide semiconductor (LDMOS) device may be applied to a VLSI process due to its relatively simple structure. Particularly, the LDMOS device may have relatively improved electrical characteristics compared to a vertical DMOS (VDMOS) device. For example, Korean Laid-Open Patent Publication No. 10-2010-0056101 discloses a LDMOS device including an n-type RESURF (reduced surface field) region, a p-type first impurity region and an n-type second impurity region, which are formed under a gate electrode structure, so as to improve breakdown voltage and reduce on-resistance (Rsp). Further, Korean Laid Open Patent Publication No. 10-2006-0077006 discloses a high voltage semiconductor device including a conventional Double Diffused Drain (DDD) structure.

FIG. 1 is a cross-sectional view illustrating a conventional high voltage semiconductor device including a DDD structure.

Referring to FIG. 1, a conventional high voltage semiconductor device 100 includes a gate electrode structure 110 disposed on a well region 104 of a substrate 102, a source region 120 disposed in the well region 104 to be adjacent to one side of the gate electrode structure 110, a drift region 130 disposed in the well region 104 to be adjacent to another side of the gate electrode structure 110, a drain region 140 disposed in the drift region 130, and a device isolation region 106 disposed on one side of the drain region 140.

The drift region 130 is used to improve the breakdown voltage of the high voltage semiconductor device 100. However, when the size of the drift region 130 is increased to further improve the breakdown voltage of the high voltage semiconductor device 100, the leakage current to other adjacent semiconductor devices may be increased. Particularly, the electrical resistance of the drift region 130 may be increased, and the on-current of the high voltage semiconductor device 100 may be reduced.

Further, when the size of the device isolation region 106 is increased to reduce the leakage current, the overall size of the high voltage semiconductor device 100 may be increased.

SUMMARY

The present disclosure provides a high voltage semiconductor device having improved breakdown voltage and on-current.

In accordance with an aspect of the present disclosure, a high voltage semiconductor device may include a gate electrode structure disposed on a substrate; a source region disposed in the substrate to be adjacent to one side of the gate electrode structure; a first drift region disposed in the substrate to be adjacent to another side of the gate electrode structure; a drain region electrically connected with the first drift region; and a device isolation region disposed on one side of the drain region. Particularly, the first drift region may be spaced apart from the device isolation region.

In accordance with some exemplary embodiments, the drain region may be spaced apart from the gate electrode structure.

In accordance with some exemplary embodiments, the high voltage semiconductor device may further include a second drift region disposed between the first drift region and the drain region.

In accordance with some exemplary embodiments, the second drift region may have an impurity concentration higher than that of the first drift region, and the drain region may have an impurity concentration higher than that of the second drift region.

In accordance with some exemplary embodiments, the drain region may be disposed in the second drift region.

In accordance with some exemplary embodiments, the first drift region may be formed deeper than the second drift region.

In accordance with some exemplary embodiments, the first drift region, the second drift region and the drain region may be electrically connected in series.

In accordance with some exemplary embodiments, the second drift region may be partially overlapped with the first drift region.

In accordance with some exemplary embodiments, the device isolation region may be formed deeper than the first drift region.

In accordance with some exemplary embodiments, an edge portion of the gate electrode structure may be disposed on a portion of the first drift region.

In accordance with another aspect of the present disclosure, a high voltage semiconductor device may include a gate electrode structure disposed on a substrate; a source region disposed in the substrate to be adjacent to one side of the gate electrode structure; a first drift region disposed in the substrate to be adjacent to another side of the gate electrode structure; a drain region electrically connected with the first drift region, the drain region being spaced apart from the another side of the gate electrode structure; a device isolation region disposed on one side of the drain region; and an insulating region having an electrical resistance higher than that of the first drift region and disposed between the first drift region and the device isolation region.

In accordance with some exemplary embodiments, the high voltage semiconductor device may further include a second drift region disposed between the first drift region and the drain region.

In accordance with some exemplary embodiments, the first drift region may be formed deeper than the second drift region; and the insulating region may be disposed below the second drift region.

In accordance with some exemplary embodiments, the second drift region may include a portion overlapped with a portion of the first drift region and a remaining portion.

In accordance with some exemplary embodiments, the remaining portion may have an impurity concentration higher than that of the first drift region, and the overlapped portion may have an impurity concentration higher than that of the remaining portion.

In accordance with some exemplary embodiments, the insulating region may have a first conductivity type, and the first drift region may have a second conductivity type.

In accordance with some exemplary embodiments, the high voltage semiconductor device may further include a well region having the first conductivity type, and the insulating region may have at least a portion of the well region.

In accordance with still another aspect of the present disclosure, a high voltage semiconductor device may include a substrate having a well region; a gate electrode structure disposed on the well region; a source region disposed in the well region to be adjacent to one side of the gate electrode structure; a first drift region disposed in the well region to be adjacent to another side of the gate electrode structure; a drain region disposed to be spaced apart from the another side of the gate electrode structure; a second drift region configured to connect the first drift region with the drain region; and a device isolation region disposed on one side of the drain region. Particularly, the first drift region may be spaced apart from the device isolation region.

In accordance with some exemplary embodiments, the first drift region may be formed deeper than the second drift region and shallower than the device isolation region.

In accordance with some exemplary embodiments, the second drift region may include a portion overlapped with a portion of the first drift region and a remaining portion, and the drain region may be directly connected with the overlapped portion of the second drift region.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Exemplary embodiments can be understood in more detail from the following description taken in conjunction with the accompanying drawings, in which.

Figure 1:
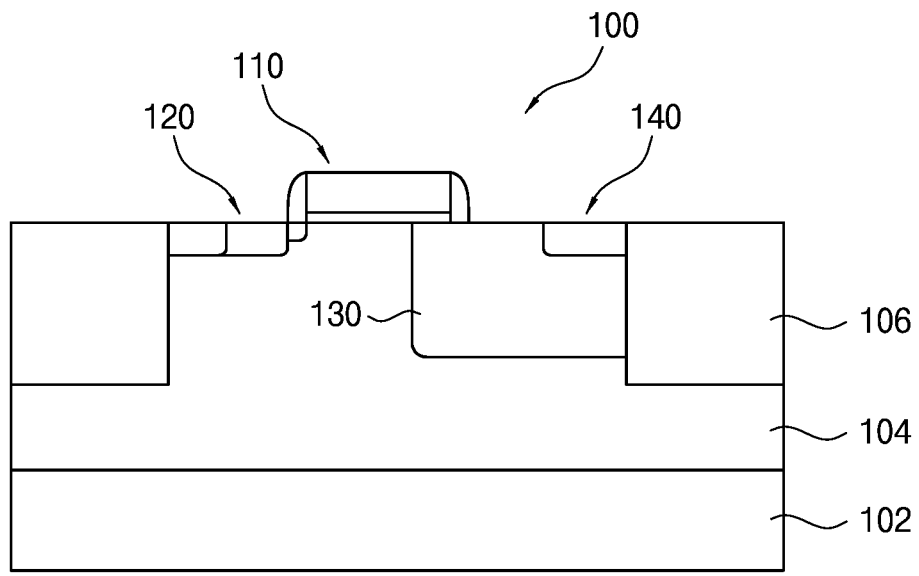
FIG. 1 is a cross-sectional view illustrating a conventional high voltage semiconductor device including a DDD structure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present disclosure are described in more detail with reference to the accompanying drawings. However, the present disclosure is not limited to the embodiments described below and is implemented in various other forms. Embodiments below are not provided to fully complete the present disclosure but rather are provided to fully convey the range of the present disclosure to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present disclosure, the regions and the layers are not limited to these terms.

Terminologies used below are used to merely describe specific embodiments, but do not limit the present disclosure. Additionally, unless otherwise defined here, all the terms including technical or scientific terms, may have the same meaning that is generally understood by those skilled in the art.

Embodiments of the present disclosure are described with reference to schematic drawings of ideal embodiments. Accordingly, changes in manufacturing methods and/or allowable errors may be expected from the forms of the drawings. Accordingly, embodiments of the present disclosure are not described being limited to the specific forms or areas in the drawings, and include the deviations of the forms. The areas may be entirely schematic, and their forms may not describe or depict accurate forms or structures in any given area, and are not intended to limit the scope of the present disclosure.

In these embodiments, directional terms such as up, down, above, below, left, and right may be used to describe the various arrangements and configurations of the layers and components of the described embodiments. These directions are merely indicative of the directions on the page, and it will be understood that the devices, designs, and embodiments described herein could be arranged in other configurations with respect to any other particular reference frame. For example, while one layer may be described as "above" or "on" another layer in the disclosure, it should be understood that a physical incarnation of the layer need not always be above the other with respect to a gravitational or other reference frame.

Figure 2:
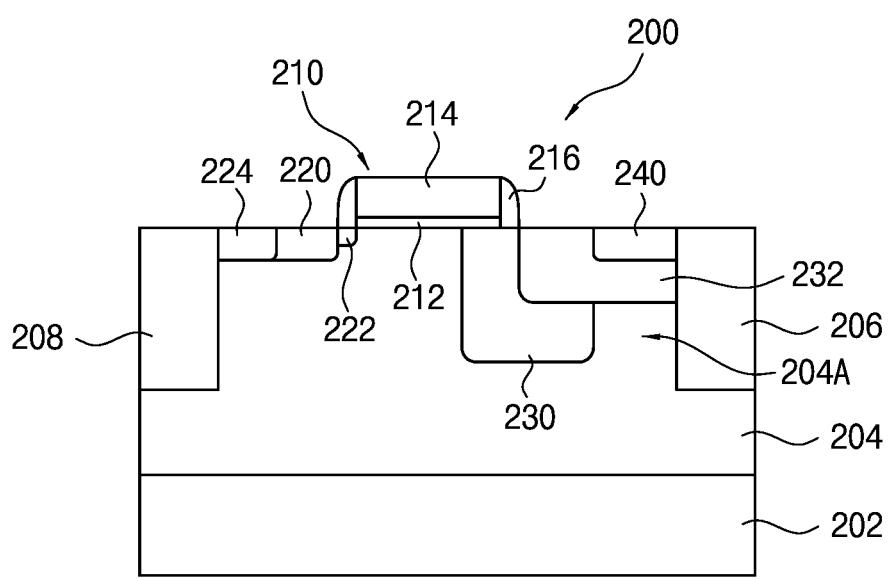
FIG. 2 is a cross-sectional view illustrating a high voltage semiconductor device in accordance with an exemplary embodiment of the present disclosure.

FIG. 2 is a cross-sectional view illustrating a high voltage semiconductor device 200 in accordance with an exemplary embodiment of the present disclosure.

Referring to FIG. 2, in accordance with an exemplary embodiment of the present disclosure, high voltage semiconductor device 200 includes a gate electrode structure 210 disposed on a substrate 202, a source region 220 disposed in the substrate 202 adjacent to one side of the gate electrode structure 210, a first drift region 230 disposed in the substrate 202 to be adjacent to another side of the gate electrode structure 210, a drain region 240 electrically connected with the first drift region 230, and a device isolation region 206 disposed on one side of the drain region 240.

The substrate 202 may have a well region 204 of a first conductivity type, and the gate electrode structure 210 may be disposed on the well region 204. The gate electrode structure 210 may include a gate insulating layer pattern 212 disposed on the well region 204, a gate electrode 214 disposed on the gate insulating layer pattern 212 and gate spacers 216 disposed on side surfaces of the gate electrode 214. For example, the gate insulating layer pattern 212 may include silicon oxide formed by a thermal oxidation process and the gate electrode 214 may include impurity doped polysilicon. The gate spacers 216 may include silicon oxide and/or silicon nitride.

The source region 220, the first drift region 230 and the drain region 240 may have a second conductivity type different from the first conductivity type. For example, when a p-type well region is used, the source region 220, the first drift region 230 and the drain region 240 may be n-type impurity regions. Alternatively, when an n-type well region is used, the source region 220, the first drift region 230 and the drain region 240 may be p-type impurity regions.

The device isolation regions 206 and 208 may include silicon oxide and/or silicon nitride and may be used to electrically isolate the high voltage semiconductor device 200 from other adjacent semiconductor devices (not shown).

The source region 220 may be disposed in the substrate 202 adjacent to one side of the gate electrode structure 210. For example, the source region 220 may be a high concentration impurity region having the second conductivity type, and a low concentration impurity region 222 having the second conductivity type may be disposed on one side of the source region 220. The low concentration impurity region 222 may be disposed just below one side of the gate electrode structure 210 and may be used to reduce the on-resistance (Rsp) of the device 200.

A tap region 224 may be disposed on another side of the source region 220 from low concentration impurity region 222. For example, the tap region 224 may be a high concentration impurity region having the first conductivity type and may be used to remove a parasitic diode effect between the well region 204 and the source region 220. Further, the second device isolation region 208 may be disposed on one side of the tap region 224.

In accordance with an exemplary embodiment of the present disclosure, the drain region 240 may be spaced apart from the gate electrode structure 210, and the first drift region 230 and the drain region 240 may be electrically connected with each other by a second drift region 232. That is, the first drift region 230, the second drift region 232 and the drain region 240 may be electrically connected in series. For example, the second drift region 232 may be disposed between the first drift region 230 and the drain region 240 and may have the second conductivity type.

The first drift region 230, the second drift region 232 and the drain region 240 may be formed by an ion implantation process. For example, as shown in FIG. 2, the drain region 240 may be formed in the second drift region 232, and the first drift region 230 may be at least partially overlapped with the second drift region 232. Further, an edge portion of the gate electrode structure 210 may be disposed on a portion of the first drift region 230, and the second drift region 232 and the drain region 240 may be disposed on a side surface of the device isolation region 206.

The first drift region 230 may be formed deeper into well region 204 than the second drift region 232 so as to improve the breakdown voltage of the high voltage semiconductor device 200. Further, the first drift region 230 may be shallower than the device isolation region 206 into well region 204 and may be spaced apart from the device isolation region 206. That is, the device isolation region 206 may be formed deeper than the first drift region 230, and thus the leakage current to other adjacent semiconductor devices may be reduced.

Particularly, a portion 204A of the well region 204 which is disposed between the first drift region 230 and the device isolation region 206 and just below the second drift region 232 may function as an insulating region. The portion 204A of the well region 204 may be fully depleted between the first and second drift regions 230 and 232 and the well region 204. Thus, the portion 204A of the well region 204 may have a relatively high electrical resistance in comparison with the first drift region 230.

As a result, the leakage current to other adjacent semiconductor devices may be significantly reduced. Further, the width of the device isolation region 206 may be relatively narrow, and thus the size of the high voltage semiconductor device 200 may be significantly reduced as compared to conventional devices. For example, the distance between the first drift region 230 and the device isolation region 206 may be approximately 0.4 µm to approximately 0.6 µm in embodiments, and the depth of the first drift region 230 may be approximately 0.5 µm to approximately 0.6 µm in embodiments. Further, the width of the device isolation region 206 may be approximately 0.5 µm to approximately 0.7 µm in embodiments. One of ordinary skill will realize that in alternative embodiments, the sizes of these components may vary even outside of the ranges described herein.

The second drift region 232 may have an impurity concentration higher than that of the first drift region 230, and the drain region 240 may have an impurity concentration higher than that of the second drift region 232. The second drift region 232 may include a portion 232A (See FIG. 5) overlapped with a portion of the first drift region 230 and a remaining portion 232B (See FIG. 5). The remaining portion 232B may have an impurity concentration higher than that of the first drift region 230, and the overlapped portion 232A may have an impurity concentration higher than that of the remaining portion 232B. Further, the drain region 240 may have an impurity concentration higher than that of the overlapped portion 232A.

Figure 5:
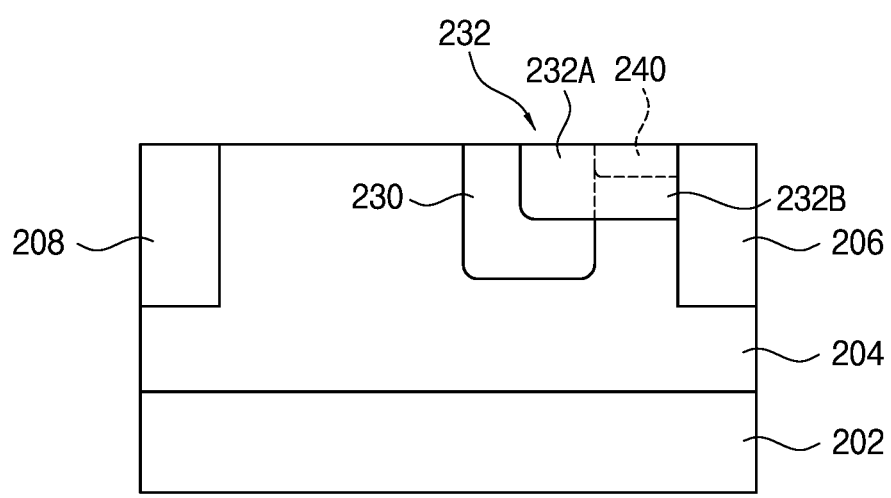

Particularly, the drain region 240 may be directly connected with the overlapped portion 232A so as to reduce the electrical resistance between the first drift region 230 and the drain region 240 (see FIG. 5). Thus, the on-current of the high voltage semiconductor device 200 may be significantly increased.

Figure 3:
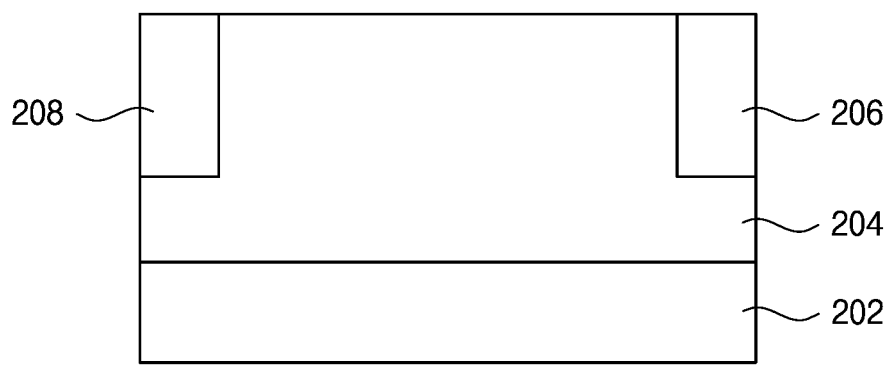
FIGS. 3 to 5 are cross-sectional views illustrating a method of manufacturing the high voltage semiconductor device as shown in FIG. 2.
Figure 4:
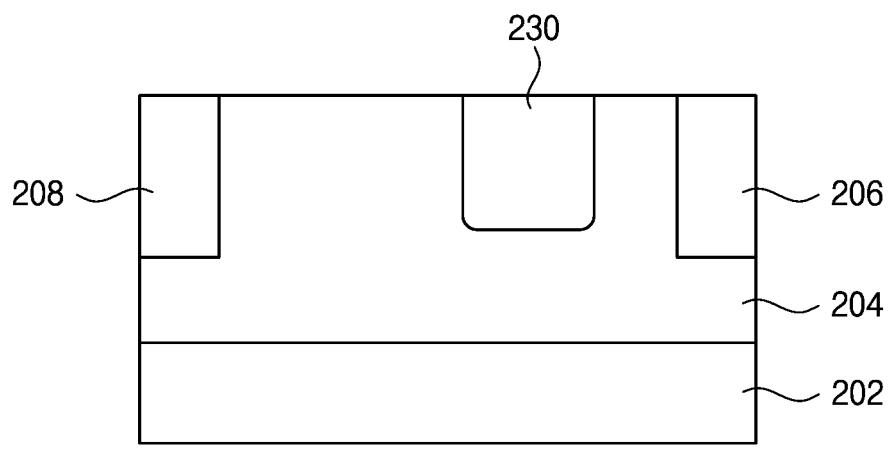

FIGS. 3 to 5 are cross-sectional views illustrating a method of manufacturing the high voltage semiconductor device 200 as shown in FIG. 2.

Referring to FIG. 3, device isolation regions 206 and 208 may be formed in a substrate 202, and a well region 204 serving as an active region of a high voltage semiconductor device 200 may then be formed in the substrate 202. For example, the device isolation regions 206 and 208 may be formed by forming trenches in surface portions of the substrate 202 by an etching process and then filling the trenches with silicon oxide and/or silicon nitride. The well region 204 may be formed deeper than the device isolation regions 206 and 208 by an ion implantation process using dopants having a first conductivity type.

Alternatively, an epitaxial layer may be formed on the substrate 202, and the device isolation regions 206 and 208 and the well region 204 may be formed in the epitaxial layer.

Referring to FIGS. 4 and 5, a first drift region 230 and a second drift region 232 may be sequentially formed in the well region 204 by an ion implantation process using dopants having a second conductivity type. The first drift region 230 may be formed deeper than the second drift region 232 and shallower than the device isolation region 206 and may be spaced apart from the device isolation region 206. Accordingly, the breakdown voltage of the high voltage semiconductor device 200 may be improved, and the leakage current to other adjacent semiconductor devices may be reduced. Further, the size of the device isolation region 206 may be relatively small, and the size of the high voltage semiconductor device 200 may thus be reduced as compared to conventional devices.

The second drift region 232 may be partially overlapped with the first drift region 230 so that the electrical connection between the first drift region 230 and the second drift region 232 may be made with ease. The second drift region 232 may have an impurity concentration higher than the first drift region 230 to improve the on-current of the high voltage semiconductor device 200.

In detail, the second drift region 232 may include a portion 232A overlapped with a portion of the first drift region 230 and a remaining portion 232B. The remaining portion 232B may have an impurity concentration higher than that of the first drift region 230, and the overlapped portion 232A may have an impurity concentration higher than that of the remaining portion 232B.

After forming the first and second drift regions 230 and 232, a gate electrode structure 210 as shown in FIG. 2 may be formed on the well region 204.

For example, a gate insulating layer may be formed on the well region 204 by a thermal oxidation process, and a gate conductive layer may be formed on the gate insulating layer by a deposition process. Then, a gate insulating layer pattern 212 and a gate electrode 214 may be formed by patterning the gate insulating layer and the gate conductive layer.

After forming the gate insulating layer pattern 212 and the gate electrode 214, a low concentration impurity region 222 may be formed in the substrate 202 to be adjacent to one side of the gate electrode 214, and gate spacers 216 may then be formed on side surfaces of the gate electrode 214. The low concentration impurity region 222 may be formed by an ion implantation process using dopants having the second conductivity type, and the spacers 216 may be formed of silicon oxide and/or silicon nitride.

Subsequently, a source region 220 and a drain region 240 may be formed by an ion implantation process using dopants having the second conductivity type, and a tab region 224 may be formed on one side of the source region 220 by an ion implantation process using dopants having the first conductivity type. The source region 220 may be formed to be adjacent to one side of the gate electrode structure 210, and the drain region 240 may be formed to be spaced apart from another side of the gate electrode structure 210. Particularly, the drain region 240 may be formed in the second drift region 232 to be directly connected with the overlapped portion 232A of the second drift region 232 as shown in FIG. 5 so as to improve the on-current of the high voltage semiconductor device 200.

In accordance with exemplary embodiments of the present disclosure as described above, a high voltage semiconductor device 200 may include a gate electrode structure 210 disposed on a substrate 202, a source region 220 disposed in the substrate 202 to be adjacent to one side of the gate electrode structure 210, a first drift region 230 disposed in the substrate 202 to be adjacent to another side of the gate electrode structure 210, a drain region 240 electrically connected with the first drift region 230, a device isolation region 206 disposed on one side of the drain region 240, and a second drift region 232 disposed between the first drift region 230 and the drain region 240. Particularly, the first drift region 230 may be spaced apart from the device isolation region 206, and a portion between the first drift region 230 and the device isolation region 206 may serve as an insulating region.

The breakdown voltage of the high voltage semiconductor device 200 may be increased by the first drift region 230, and the leakage current of the high voltage semiconductor device 200 may be reduced by the insulating region 204A. As a result, the width of the device isolation region 206 may be relatively reduced, and the overall size of the high voltage semiconductor device 200 may be relatively reduced, as compared to conventional devices.

Further, the electrical resistance between the first drift region 230 and the drain region 240 may be reduced by the second drift region 232, and the on-current of the high voltage semiconductor device 200 may thus be significantly improved/increased.

Although the high voltage semiconductor device 200 has been described with reference to specific embodiments, it is not limited thereto. Therefore, it will be readily understood by those skilled in the art that various modifications and changes can be made thereto without departing from the spirit and scope of the present disclosure defined by the appended claims.

The invention claimed is:

1. A high voltage semiconductor device comprising:
a gate electrode structure disposed on a substrate;
a source region disposed in the substrate adjacent to a first portion of the gate electrode structure;
a first drift region disposed in the substrate adjacent to a second portion of the gate electrode structure;
a drain region electrically connected with the first drift region;
a device isolation region disposed on one side of the drain region; and
a second drift region disposed between the first drift region and the drain region,
wherein the first drift region is spaced apart from the device isolation region, and the drain region is electrically connected with the first drift region by the second drift region.

2. The high voltage semiconductor device of claim 1, wherein the drain region is spaced apart from the gate electrode structure.

3. The high voltage semiconductor device of claim 1, wherein the second drift region has an impurity concentration higher than that of the first drift region; and
the drain region has an impurity concentration higher than that of the second drift region.

4. The high voltage semiconductor device of claim 1, wherein the drain region is disposed in the second drift region.

5. The high voltage semiconductor device of claim 1, wherein the first drift region is formed deeper than the second drift region.

6. The high voltage semiconductor device of claim 1, wherein the first drift region, the second drift region and the drain region are electrically connected in series.

7. The high voltage semiconductor device of claim 1, wherein the second drift region is partially overlapped with the first drift region.

8. The high voltage semiconductor device of claim 1, wherein the device isolation region is formed deeper than the first drift region.

9. The high voltage semiconductor device of claim 1, wherein an edge portion of the gate electrode structure is disposed on a portion of the first drift region.

10. A high voltage semiconductor device comprising:
a gate electrode structure disposed on a substrate;
a source region disposed in the substrate to be adjacent to one side of the gate electrode structure;
a first drift region disposed in the substrate to be adjacent to another side of the gate electrode structure;
a drain region electrically connected with the first drift region, the drain region being spaced apart from the another side of the gate electrode structure;
a device isolation region disposed on one side of the drain region; and
an insulating region having an electrical resistance higher than that of the first drift region and disposed between the first drift region and the device isolation region.

11. The high voltage semiconductor device of claim 10, further comprising a second drift region disposed between the first drift region and the drain region.

12. The high voltage semiconductor device of claim 11, wherein the first drift region is formed deeper than the second drift region; and
the insulating region is disposed below the second drift region.

13. The high voltage semiconductor device of claim 11, wherein the second drift region comprises a portion overlapped with a portion of the first drift region and a remaining portion.

14. The high voltage semiconductor device of claim 13, wherein the remaining portion has an impurity concentration higher than that of the first drift region; and
the overlapped portion has an impurity concentration higher than that of the remaining portion.

15. The high voltage semiconductor device of claim 10, wherein the insulating region has a first conductivity type; and
the first drift region has a second conductivity type.

16. The high voltage semiconductor device of claim 15, further comprising a well region having the first conductivity type,
wherein the insulating region comprises at least a portion of the well region.

17. A high voltage semiconductor device comprising:
a substrate having a well region;
a gate electrode structure disposed on the well region;
a source region disposed in the well region to be adjacent to one side of the gate electrode structure;
a first drift region disposed in the well region to be adjacent to another side of the gate electrode structure;
a drain region disposed to be spaced apart from the another side of the gate electrode structure;
a second drift region configured to connect the first drift region with the drain region; and
a device isolation region disposed on one side of the drain region,
wherein the first drift region is spaced apart from the device isolation region.

18. The high voltage semiconductor device of claim 17, wherein the first drift region is formed deeper than the second drift region and shallower than the device isolation region.

19. The high voltage semiconductor device of claim 17, wherein the second drift region comprises a portion overlapped with a portion of the first drift region and a remaining portion; and
the drain region is directly connected with the overlapped portion of the second drift region.

* * * * *